United States Patent

Götz et al.

[11] Patent Number: 5,144,305
[45] Date of Patent: Sep. 1, 1992

[54] TRANSMISSION ARRANGEMENT COMPRISING A BLOCK CODE ENCODED MAIN CHANNEL AND AN AUXILIARY CHANNEL

[75] Inventors: Hans J. Götz, Nürnberg; Rainer Hembes, Ober-Olm, both of Fed. Rep. of Germany

[73] Assignee: U.S. Philips Corporation, New York, N.Y.

[21] Appl. No.: 718,732

[22] Filed: Jun. 21, 1991

[30] Foreign Application Priority Data

Jun. 30, 1990 [DE] Fed. Rep. of Germany ....... 4020963

[51] Int. Cl.$^5$ .......................... H03M 7/00; H04J 3/12
[52] U.S. Cl. .................................... 341/73; 341/100; 341/101; 370/110.1; 370/111
[58] Field of Search .................. 341/73, 100, 101, 50; 370/110.1, 111

[56] References Cited

U.S. PATENT DOCUMENTS 3,914,553 10/1975 Melindo et al. ................ 341/100 X
4,750,173 6/1988 Bluthgen ............................ 370/111
4,876,695 10/1989 Witters et al. ............... 370/110.1 X

FOREIGN PATENT DOCUMENTS 0047354 3/1983 Japan ..................................... 341/73
1295524 3/1907 U.S.S.R. ................................. 341/73

*Primary Examiner*—Sharon D. Logan
*Attorney, Agent, or Firm*—David R. Treacy

[57] ABSTRACT

A block encoded main signal and a balanced block encoded auxiliary signal are combined on a transmission path. The combined signal includes at least one block of encoded main channel signal alternating with one bit of the auxiliary channel signal. The block code for the auxiliary channel is simpler than the block code for the main channel.

12 Claims, 3 Drawing Sheets

TRANSMISSION ARRANGEMENT COMPRISING A BLOCK CODE ENCODED MAIN CHANNEL AND AN AUXILIARY CHANNEL

The invention relates to a transmission arrangement for a digital transmission link, comprising a block code encoded main channel and an auxiliary channel.

In digital transmission arrangements there is often a need for transmitting over the same transmission arrangement auxiliary data in addition to the data to be transmitted. Typically, the data to be transmitted in essence are transmitted over a main channel and the additional data to be transmitted are transmitted over an auxiliary channel. The data rate of the auxiliary channel is, in essence, smaller than the data rate of the main channel. The auxiliary channel is mostly used for telemetric data or used as a so-called service channel for speech communications.

In the main channel one often uses a block code for error protection, in which each n successive data elements are combined to a single code word consisting of m (m greater than n) bits. Such a block code, according to which each five binary data elements are combined to a single 6-bit binary data word, is used by the German Post Office in 140 Mbit/s glass fibre transmission links.

For example, German Patent Application DE 35 22 130 discloses a digital transmission link connected by means of light waveguides to a line terminating unit at the beginning of the link and a line terminating unit at the end of the link and also to a main channel led over the light waveguide and having 5-bit/6-bit encoding. The main channel embeds an auxiliary channel on the basis of the code redundancy of the 5-bit/6-bit encoding. A 5-bit/6-bit encoder with an auxiliary channel encoder is assigned to the line terminating unit at the beginning of the link and a 6-bit/5-bit decoder with an auxiliary channel decoder is assigned to the line terminating unit at the end of the link. For each direction of transmission an auxiliary channel decoder and an auxiliary channel encoder are assigned to the repeaters arranged at specific distances between the line terminating units.

In such transmission systems comprising an auxiliary channel, in which the auxiliary channel is realised on the basis of a code violation, when an auxiliary channel is derived and inserted, especially at the locations of the repeaters, also the main channel has to be completely decoded and subsequently encoded.

It is an object of the present invention to provide an auxiliary channel in a transmission arrangement of the type mentioned in the preamble, which can be manufactured with the least possible expenditure in respect of circuit technology.

This object is achieved by means of a transmission arrangement according to the invention, in that the auxiliary channel is separately encoded with a second balanced block code and in that the data stream to be transmitted consists alternately of one or a plurality of blocks of the main channel and a bit of the block-encoded auxiliary channel, whereas the block code used for the auxiliary channel has a simpler structure than the block code used for the main channel.

A block code having a relatively complex coding rule may customarily be used for the main channel. The complex coding rule causes only a slight increase of the bit rate when block coding is performed. On the other hand, for the auxiliary channel it is advantageous to use a relatively simple coding rule, for example, a 1-bit/2-bit encoding. The invention is based on the consideration that the relatively large increase of the bit rate of the auxiliary channel (a doubling with a 1-bit/2-bit encoding) is tolerable. Then again the circuitry and cost for the coding and decoding is very small.

Furthermore, the invention is based on the recognition that for the main channel mostly so-called balanced block codes are used. Balanced block codes are those for which it is guaranteed that the different separate code pulses produced by means of the block code forming rule are uniformly distributed on average irrespective of the content of the encoded data elements. The use of a balanced block code in the auxiliary channel is furthermore advantageous in a main channel encoded by a balanced block code that also the multiplex signal comprising the main signal and the auxiliary signal is always balanced without the need for specific additional encoding or monitoring costs.

By alternately transmitting blocks of the block encoded main channel and a bit of the likewise block encoded auxiliary channel it is possible to provide a simple insertion or extraction of the auxiliary channel over multiplexers or demultiplexers which are relatively simple to arrange, because only the auxiliary signal is to be completely decoded for extraction or insertion, whereas the main signal can be transported without being decoded. The number of structural parts which may consequently be kept low have a small power consumption, a high reliability and low cost level.

The invention is generally advantageous in that the function of the auxiliary channel does not depend on the contents of the main channel. An adaptation of the transmission method to the required transmission rate in the auxiliary channel is possible because a plurality of blocks of the main channel is transmitted alternately with a single bit from the auxiliary channel.

It is especially advantageous to use a so-called CMI code (Code Mark Inversion) or a CD code (Conditioned Diphase) for a 1-bit/2-bit encoding of the auxiliary channel. These codes make a simple encoding and decoding arrangement possible for the auxiliary channel and also a simple monitoring of the word synchronization. Both the coding rule of the auxiliary channel and that of the main channel can be used as a criterion for establishing the word synchronization. Since the two codes have on average equally many ones and zeros, i.e. are balanced, this also holds in an advantageous manner for the multiplex signal formed from the main signal and the auxiliary signal.

The invention will be further explained and described with reference to a drawing representing an exemplary embodiment, in which.

Figure 1:
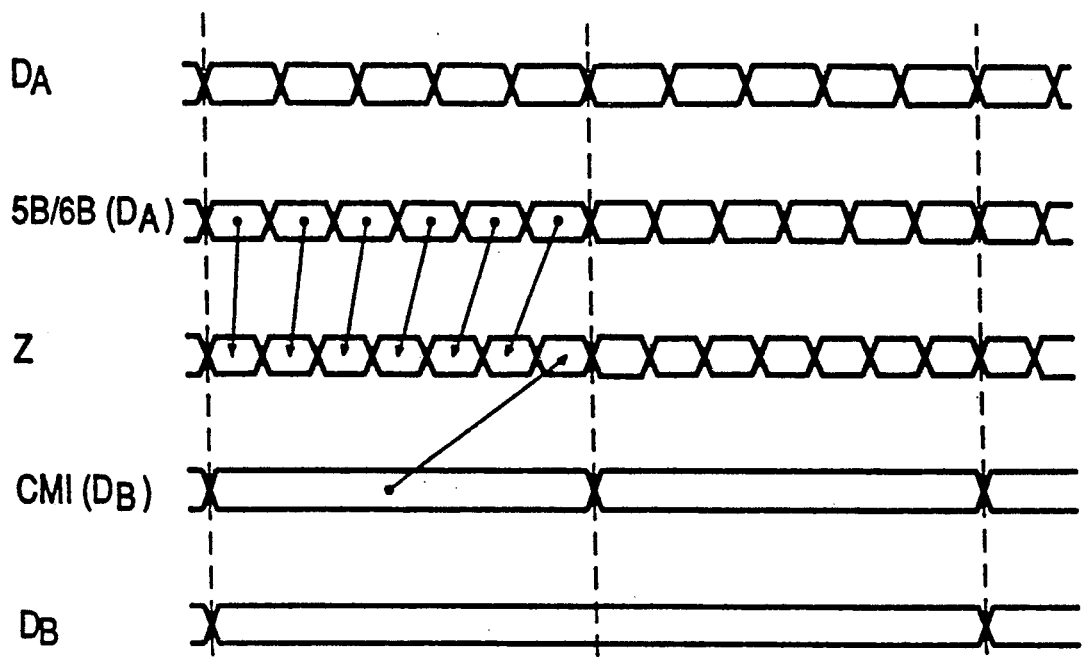
FIG. 1 shows a multiplex signal comprising a main signal and an auxiliary signal.
Figure 2:
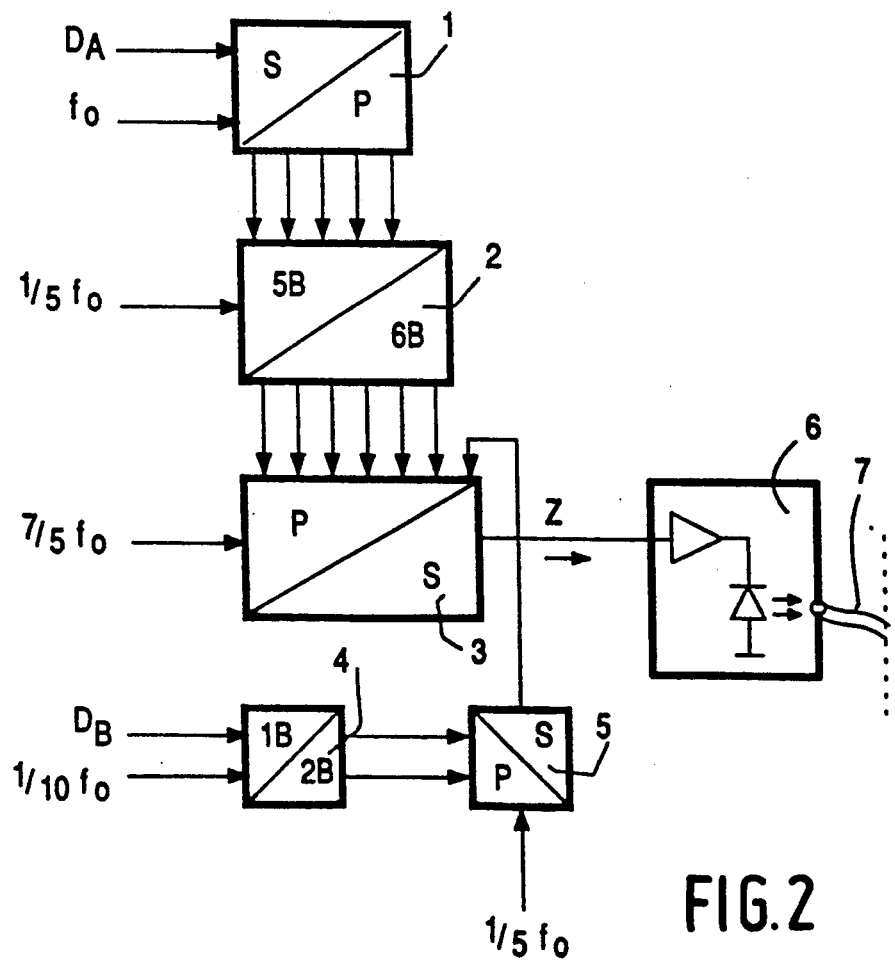
FIG. 2 shows a line terminating unit for transmitting the multiplex signal.

In the exemplary embodiment the data rate of an auxiliary signal $D_B$ is only 1/10 of the data rate of a main signal $D_A$. In a serial-parallel converter 1, which is clocked with the data rate $f_0$ of the main signal $D_A$, five successive bits of the main signal $D_A$ are each time converted into data words comprising five bits. These data words are applied to a 5-bit/6-bit encoder 2 which is clocked with one fifth of the data rate of the main signal. The 5-bit/6-bit encoder 2 allocates 6-bit-wide code words 5B/6B($D_A$) to the 5-bit data words in accordance with a 5-bit/6-bit coding rule. These code word bits available at the six outputs of the 5-bit/6-bit converter 2 are applied to the first six inputs of a parallel-serial converter 3. The auxiliary signal $D_B$ is applied to a CMI coder 4 which is clocked with the data rate of the auxiliary signal. The 2 bits of the CMI line code allocated to each bit of the auxiliary signal are applied to a second parallel-serial converter 5 which is clocked with half the data rate of the auxiliary signal. The output signal of the second parallel-serial converter 5 is applied to the seventh input of the first parallel-serial converter 3. The first parallel-serial converter 3 is clocked with 7/5 the clock rate of the main signal. In this fashion a data stream Z is developed at the output of the first parallel-serial converter 3, which data stream comprises 6 bits of the 5-bit/6-bit line code and one bit of the CMI line code CMI($D_B$). This data stream is sent to an optical transmitter 6 which transports the data stream over a glass fibre 7.

Figure 3:
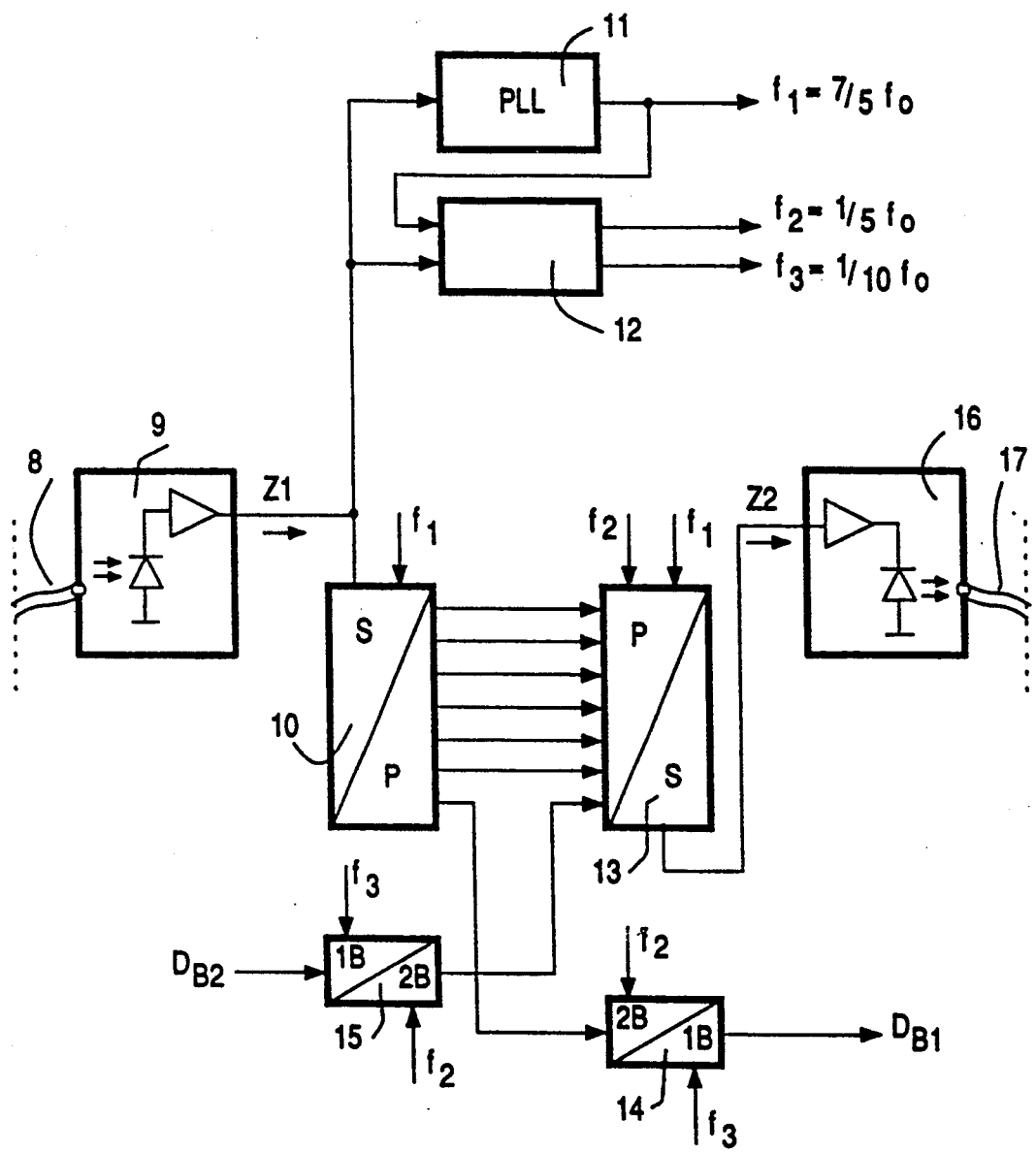
FIG. 3 shows a repeater with insertion and extraction of the auxiliary channel.

FIG. 3 represents a repeater which derives an auxiliary signal $D_{B1}$ contained in an arriving data stream Z1 and inserts a second auxiliary signal $D_{B2}$ into a departing data stream Z2. The data stream Z1 arriving over a glass fibre 8 is converted into a data stream comprising several bits in an optical receiver 9. The data stream Z1 is applied to a serial-parallel converter 10 on the side of the repeater and also to an arrangement for clock recovery 11 and an arrangement for word structure recognition 12. By means of a phase-locked loop (PLL) the transmit clock is recovered from the data stream Z1. The recovered data clock is also applied to the arrangement for word structure recognition 12. On the basis of the described running digital sum value (LDS) of the 5-bit/6-bit block encoding the arrangement for word structure recognition 12 recognizes the beginning of each transmitted 7-bit data word. Each time at the beginning of a transmitted data word the arrangement generates a pulse and by binary division of successive pulses a second pulse sequence $f_3$ with every other pulse of the pulse sequence $f_2$ occurring in this manner.

The first six outputs of the serial-parallel converter 10 are connected to the first six inputs of a parallel-serial converter 13. The seventh output of the serial-parallel converter 10 is connected to a CMI decoder 14 which is clocked with the second pulse sequence $f_3$. In this manner the one bit of the CMI encoded auxiliary signal is singled out at the right location and recovered from pairs of successive bits of the singled out bits of the original data content of the transmitted auxiliary signal.

A new auxiliary signal $D_{B2}$ to be inserted is applied to a CMI coder 15 on the repeater side, to which coder also the pulse sequences $f_2$ and $f_3$ are applied. The output of the CMI coder 15 is connected to the seventh input of the parallel-serial converter 13. With each pulse of the first pulse sequence $f_2$ the bits applied to the seven inputs of the parallel-serial converter 13 are taken over and ejected from the parallel-serial converter 13 with the recovered clock rate $f_1$ of the data signal. The new data stream Z2 produced in this manner in which only the bits relating to the auxiliary signal are changed relative to the input signal, is applied to an optical transmitter 16 on the side of the repeater, which transmitter transmits the data signal Z2 over a glass fibre line 17.

Because the auxiliary signal is embedded in the main signal bit-by-bit, as has been described hereinbefore, a simple insertion and extraction of the auxiliary signal is possible without the need for decoding the original main signal.

Figure 4:
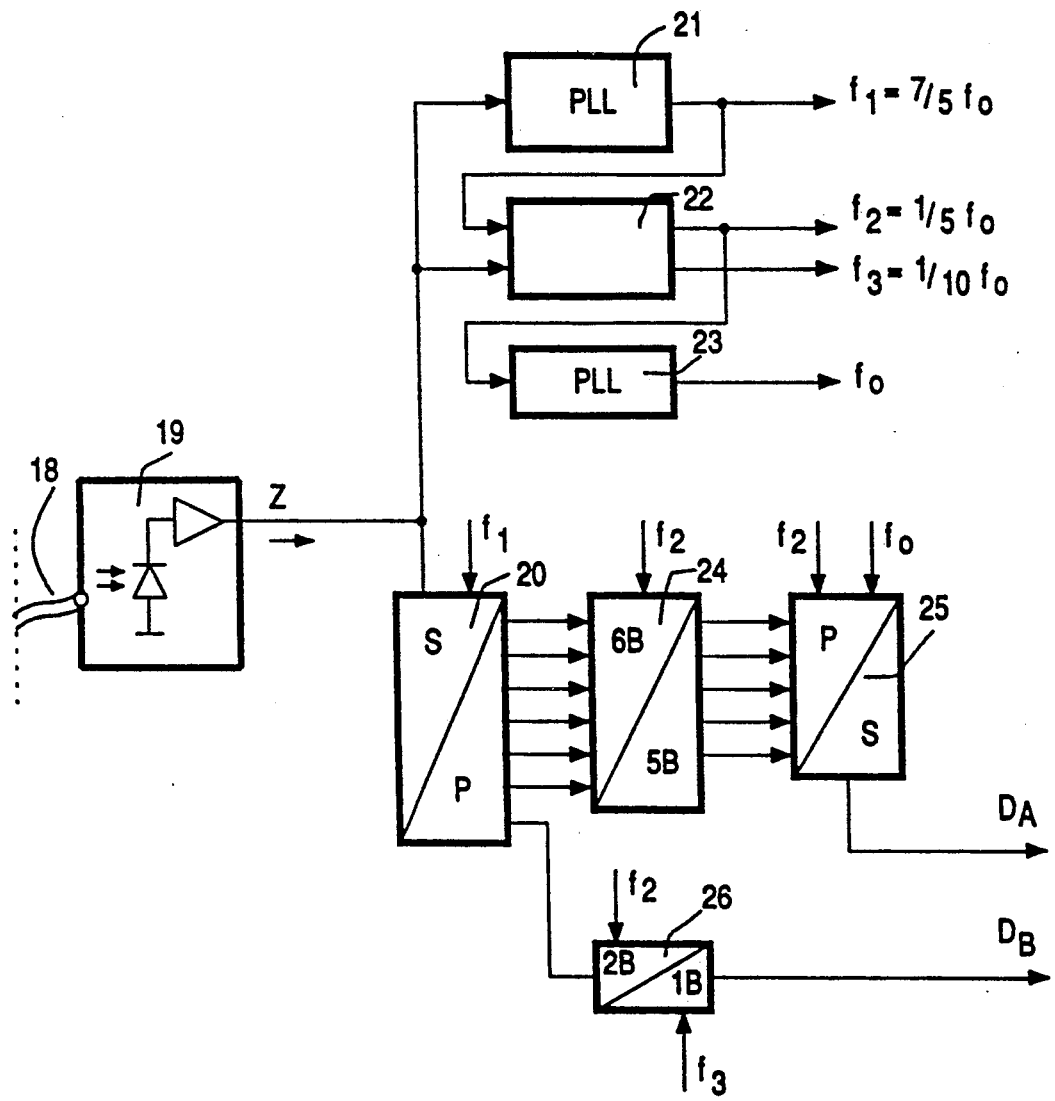
FIG. 4 shows a line terminating unit for receiving the multiplex signal.

FIG. 4 shows a line terminating unit for receiving and separating a data stream Z arriving over a glass fibre line 18. The data signal Z converted by an optical receiver 19 is applied, as with a repeater of a serial-parallel converter 20 on the receive side, to an arrangement, on the receive side, for first clock recovery 21 and an arrangement, on the receive side, for word structure recognition 22. The first arrangement for word clock recovery 21 and the arrangement for word structure recognition 22 produce, in the same fashion as was discussed with respect to the repeater, a first clock signal $f_1$ at the data rate of the data stream Z and two pulse sequences $f_2$ and $f_3$ at the data rate of the CMI encoded auxiliary signal or the data rate of the auxiliary signal $D_B$ respectively. The first pulse sequence $f_2$ is applied to a second clock recovery unit 23 in which a clock signal $f_0$ corresponding to the data rate of the main signal $D_A$ is recovered by means of a phase-locked loop (PLL).

The serial-parallel converter 20 is clocked with a first clock signal $f_1$. Its first six outputs are connected to a 6-bit/5-bit decoder 24. By means of the clock pulses of the first pulse sequence $f_2$ the data word corresponding to the originally encoded 5-bit-wide data word is recovered at the appropriate instants from the 6-bit-wide data words at the inputs of the 6-bit/5-bit decoder 24 and applied to a parallel-serial converter 25. From the parallel-serial converter 25 the individual data bits are read out at the original data rate $f_0$ and thus produce the original data signal $D_A$.

The seventh output of the serial-parallel converter 20 is connected to a CMI decoder 26. From each two successive data bits of the CMI encoded auxiliary signal the CMI decoder 26 produces a bit of the original auxiliary signal $D_B$.

We claim:

1. A transmitting arrangement for digital data, comprising first means for providing a data signal encoded with a first block code, to form a main signal for transmission on a main channel, characterized in that the arrangement further comprises:
    second means for separately encoding auxiliary data with a balanced second block code having a simpler structure than said first block code, to form an auxiliary signal for transmission on an auxiliary channel, and
    means for transmitting said main and auxiliary signals as a data stream arranged such that the data stream consists alternately of at least one block of the main channel and a bit of the block-encoded auxiliary channel.

2. An arrangement as claimed in claim 1, characterized in that said second block code is a CMI code.

3. An arrangement as claimed in claim 1, characterized in that said second block code is a CD code.

4. An arrangement as claimed in claim 3, characterized in that said arrangement is a line terminating unit, in which said first means comprises a five-bit/six-bit encoder, said second means comprises a one-bit/two-bit encoder, and said means for transmitting comprises respective first and second parallel-serial converters,
    said first converter has an input connected to receive an output of said one-bit/two-bit encoder, and said second converter has one input connected to receive an output of said first converter, and other inputs connected to receive an output of said five-bit/six-bit encoder, said second converter having an output which is said bit stream.

5. An arrangement as claimed in claim 2, characterized in that said arrangement is a line terminating unit, in which said first means comprises a five-bit/six-bit encoder, said second means comprises a one-bit/two-bit encoder, and said means for transmitting comprises respective first and second parallel-serial converters, said first converter has an input connected to receive an output of said one-bit/two-bit encoder, and said second converter has one input connected to receive an output of said first converter, and other inputs connected to receive an output of said five-bit/six-bit encoder, said second converter having an output which is said bit stream.

6. An arrangement as claimed in claim 1, characterized in that said arrangement is a line terminating unit, in which said first means comprises a five-bit/six-bit encoder, said second means comprises a one-bit/two-bit encoder, and said means for transmitting comprises respective first and second parallel-serial converters, said first converter has an input connected to receive an output of said one-bit/two-bit encoder, and said second converter has one input connected to receive an output of said first converter, and other inputs connected to receive an output of said five-bit/six-bit encoder, said second converter having an output which is said bit stream.

7. An arrangement as claimed in claim 3, characterized in that said auxiliary signal is a second auxiliary signal, said arrangement is a repeater for receiving an input data stream including said main signal and a first auxiliary signal, and for transmitting an output data stream including said main sign and said second auxiliary signal, said arrangement further comprises a serial-parallel converter connected to receive said input data stream, and a two-bit/one-bit converter, said means for transmitting comprises a parallel-serial converter, said second means comprises a one-bit/two-bit converter, and one output of the serial-parallel converter is connected to said two-bit/one-bit converter to provide said first auxiliary signal, and the other outputs of the serial-parallel converter are connected to all but one of a plurality of inputs of the parallel-serial converter, and an output of said one-bit/two-bit converter is connected to said one input of said parallel-serial converter.

8. An arrangement as claimed in claim 2, characterized in that said auxiliary signal is a second auxiliary signal, said arrangement is a repeater for receiving an input data stream including said main signal and a first auxiliary signal, and for transmitting an output data stream including said main sign and said second auxiliary signal, said arrangement further comprises a serial-parallel converter connected to receive said input data stream, and a two-bit/one-bit converter, said means for transmitting comprises a parallel-serial converter, said second means comprises a one-bit/two-bit converter, and one output of the serial-parallel converter is connected to said two-bit/one-bit converter to provide said first auxiliary signal, and the other outputs of the serial-parallel converter are connected to all but one of a plurality of inputs of the parallel-serial converter, and an output of said one-bit/two-bit converter is connected to said one input of said parallel-serial converter.

9. An arrangement as claimed in claim 1, characterized in that said auxiliary signal is a second auxiliary signal, said arrangement is a repeater for receiving an input data stream including said main signal and a first auxiliary signal, and for transmitting an output data stream including said main sign and said second auxiliary signal, said arrangement further comprises a serial-parallel converter connected to receive said input data stream, and a two-bit/one-bit converter, said means for transmitting comprises a parallel-serial converter, said second means comprises a one-bit/two-bit converter, and one output of the serial-parallel converter is connected to said two-bit/one-bit converter to provide said first auxiliary signal, and the other outputs of the serial-parallel converter are connected to all but one of a plurality of inputs of the parallel-serial converter, and an output of said one-bit/two-bit converter is connected to said one input of said parallel-serial converter.

10. A line terminating unit for receiving a data stream including alternately at least one block of a main signal encoded with a first block code, and one bit of an auxiliary signal encoded with a balanced second block code, comprising a serial-parallel converter connected to receive said data stream, a two-bit/one-bit converter and a six-bit/five-bit converter, one output of said serial-parallel converter being connected to said two-bit/one-bit converter to provide an auxiliary channel output, and the other outputs of said serial-parallel converter being connected to said six-bit/five-bit converter to provide said main signal.

11. A unit as claimed in claim 10, characterized in that said second block code is a CMI code.

12. A unit as claimed in claim 10, characterized in that said second block code is a CD code.

* * * * *